United States Patent
Ikawa

(10) Patent No.: US 10,321,579 B2
(45) Date of Patent: Jun. 11, 2019

(54) SOLDER RESIST AND PRINTED WIRING BOARD

(71) Applicant: IBIDEN CO., LTD., Ogaki (JP)

(72) Inventor: Yuji Ikawa, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/657,510

(22) Filed: Jul. 24, 2017

(65) Prior Publication Data

US 2018/0027664 A1 Jan. 25, 2018

(30) Foreign Application Priority Data

Jul. 22, 2016 (JP) ................. 2016-144131

(51) Int. Cl.
| | |
|---|---|
| *H05K 3/34* | (2006.01) |
| *H05K 3/24* | (2006.01) |
| *H05K 3/28* | (2006.01) |
| *H05K 3/46* | (2006.01) |

(52) U.S. Cl.
CPC ........... *H05K 3/3452* (2013.01); *H05K 3/243* (2013.01); *H05K 3/28* (2013.01); *H05K 3/285* (2013.01); *H05K 3/4644* (2013.01); *H05K 2201/0195* (2013.01); *H05K 2201/0209* (2013.01); *H05K 2201/10977* (2013.01); *H05K 2203/0577* (2013.01)

(58) Field of Classification Search
CPC .............. H05K 3/3452; H05K 3/3457; H05K 2201/0166; H05K 2201/099; H05K 2201/0989; H05K 2203/0574; H05K 2203/0577; H05K 3/243; H05K 3/28; H05K 3/285; H05K 3/4644; H05K 2201/0195; H05K 2201/0209; H05K 2201/10977

See application file for complete search history.

(56) References Cited

U.S. PATENT DOCUMENTS

| | | | | | |
|---|---|---|---|---|---|
| 4,559,292 | A | * | 12/1985 | Geissler | G03F 7/346 430/256 |
| 5,976,762 | A | * | 11/1999 | Takayanagi | G03F 7/11 430/260 |
| 9,237,649 | B2 | * | 1/2016 | Yugawa | H05K 1/115 |
| 2008/0041615 | A1 | * | 2/2008 | Zhong | H05K 3/285 174/255 |
| 2009/0057928 | A1 | * | 3/2009 | Zhai | H01L 21/563 438/106 |
| 2009/0218672 | A1 | * | 9/2009 | Nakamura | B32B 27/12 174/250 |
| 2012/0301825 | A1 | * | 11/2012 | Yoshida | G03F 7/0047 430/270.1 |
| 2015/0382473 | A1 | * | 12/2015 | Okamoto | G03F 7/11 430/270.1 |

FOREIGN PATENT DOCUMENTS

| | | | |
|---|---|---|---|
| JP | H05-007081 A | | 1/1993 |
| JP | 10207046 A | * | 8/1998 |
| JP | 2003110246 A | * | 4/2003 |

\* cited by examiner

*Primary Examiner* — Roshn K Varghese
(74) *Attorney, Agent, or Firm* — Oblon, McClelland, Maier & Neustadt, L.L.P.

(57) ABSTRACT

A solder resist includes a lower layer including a first resin and particles, and an upper layer including a second resin and formed on the lower layer. The particles are one kind selected from a group of inorganic particles, and the upper layer is formed such that the upper layer does not contain any kind of particles belonging to the group of inorganic particles.

20 Claims, 4 Drawing Sheets

SOLDER RESIST AND PRINTED WIRING BOARD

CROSS-REFERENCE TO RELATED APPLICATIONS

The present application is based upon and claims the benefit of priority to Japanese Patent Application No. 2016-144131, filed Jul. 22, 2016, the entire contents of which are incorporated herein by reference.

BACKGROUND OF THE INVENTION

Field of the Invention

The present invention relates to a solder resist and to a printed wiring board having a solder-resist layer formed with the solder resist.

Description of Background Art

JPH05-7081A describes a method for manufacturing a multilayer wiring board. The entire contents of this publication are incorporated herein by reference.

SUMMARY OF THE INVENTION

According to one aspect of the present invention, a solder resist includes a lower layer including a first resin and particles, and an upper layer including a second resin and formed on the lower layer. The particles are one kind selected from a group of inorganic particles, and the upper layer is formed such that the upper layer does not contain any kind of particles belonging to the group of inorganic particles.

According to another aspect of the present invention, a printed wiring board includes an outermost resin insulation layer, an outermost conductive layer formed on the outermost resin insulation layer, and a solder-resist layer formed on the outermost resin insulation layer and having opening portions formed such that the opening portions are exposed portions of the outermost conductive layer. The solder-resist layer includes a lower layer including a first resin and particles, and an upper layer including a second resin and formed on the lower layer, the particles are one kind selected from a group of inorganic particles, and the upper layer is formed such that the upper layer does not contain any kind of particles belonging to the group of inorganic particles.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
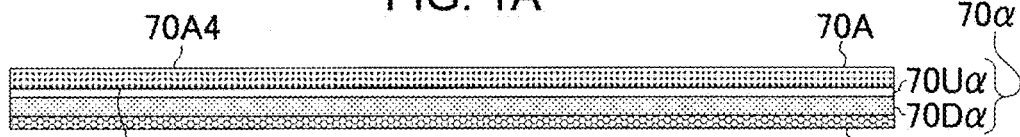
FIG. 1A to FIG. 1F show a printed wiring board and its manufacturing processes according to a first embodiment, along with an applied example.

Embodiments will now be described with reference to the accompanying drawings, wherein like reference numerals designate corresponding or identical elements throughout the various drawings.

First Embodiment

Figure 1B:
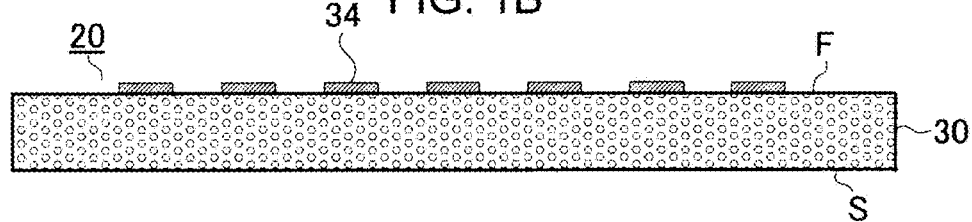
Figure 1C:
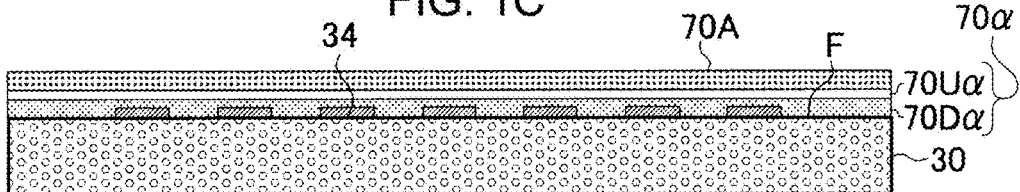
Figure 1D:
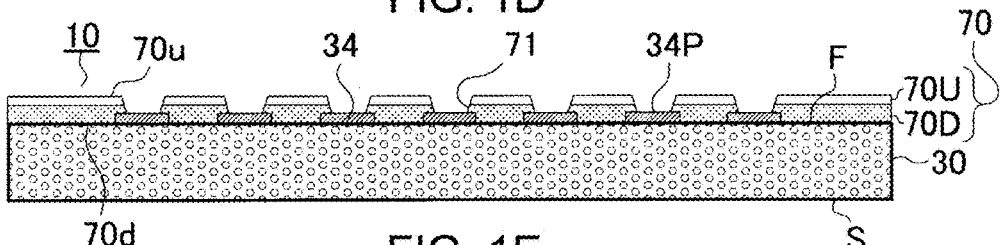

FIG. 1D shows printed wiring board 10 according to a first embodiment.

Printed wiring board 10 in FIG. 1D is structured to have resin insulation layer (outermost resin insulation layer) 30, conductive layer (outermost conductive layer) 34 formed on resin insulation layer 30, and solder-resist layer 70 having openings 71 to expose conductive layer 34 formed on resin insulation layer 30.

Solder-resist layer 70 has upper surface (70u) and lower surface (70d) opposite upper surface (70u), and lower surface (70d) faces resin insulation layer 30. Upper surface (70u) faces outward, while lower surface (70d) is in contact with resin insulation layer 30.

Solder-resist layer 70 is structured to have lower layer (70D) formed on resin insulation layer 30 and upper layer (70U) formed on lower layer (70D). Lower layer (70D) is formed directly on resin insulation layer 30, and upper layer (70U) is formed directly on lower layer (70D).

Lower layer (70D) contains a first resin and one kind of particles belonging to a group of inorganic particles, whereas upper layer (70U) contains a second resin but no inorganic particles. Upper layer (70U) contains no inorganic particles at all. Upper layer (70U) does not contain any kind of particles belonging to a group of inorganic particles. The component of first resin contained in lower layer (70D) is preferred to be the same as the component of second resin contained in upper layer (70U). The first and second resins are preferred to be the same.

Figure 1E:
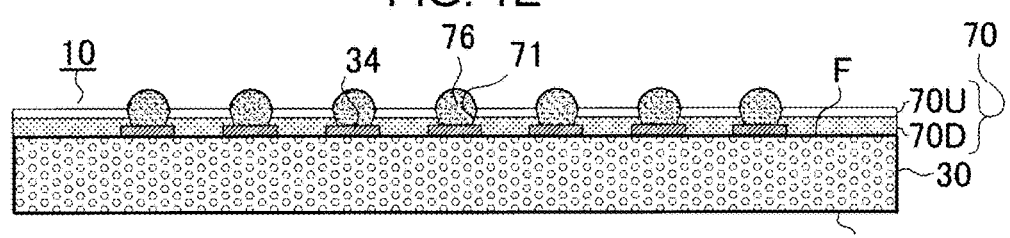
Figure 1F:
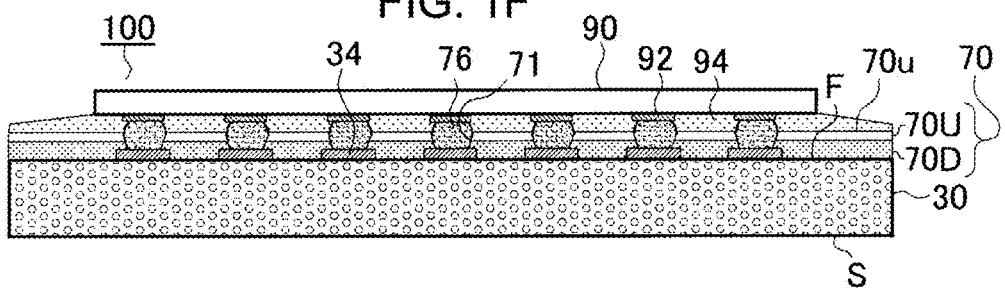

Conductive layer 34 exposed through openings 71 forms pads (34P). As shown in FIG. 1E, solder bumps 76 are formed on pads (34P). Electronic component 90 such as an IC chip is mounted on printed wiring board 10 through solder bumps 76. Underfill 94 is filled between solder-resist layer 70 of printed wiring board 10 and electronic component 90. Applied example 100 is formed with printed wiring board 10, electronic component 90 mounted on printed wiring board 10 and underfill 94 filled between printed wiring board 10 and electronic component 90. FIG. 1F shows applied example 100.

As shown in FIG. 1F, underfill 94 is formed on upper layer (70U) which does not contain inorganic particles. Since there are no inorganic particles present in upper layer (70U), no organic particles are exposed on upper surface (70u) of upper layer (70U) (upper surface of solder-resist layer (70F)). Accordingly, the surface condition of upper surface (70u) of solder-resist layer 70 is thought to be uniform. The wettability of upper surface (70u) is thought to be uniform. Underfill 94 is thought to be spread evenly on upper surface (70u). Even when the gap between electronic component 90 and printed wiring board 10 is small, it is easier to fill the gap with underfill 94. Adhesive strength between underfill 94 and solder-resist layer 70 shows smaller variations, making it less likely for underfill 94 to peel off solder-resist layer 70.

Figure 3A:
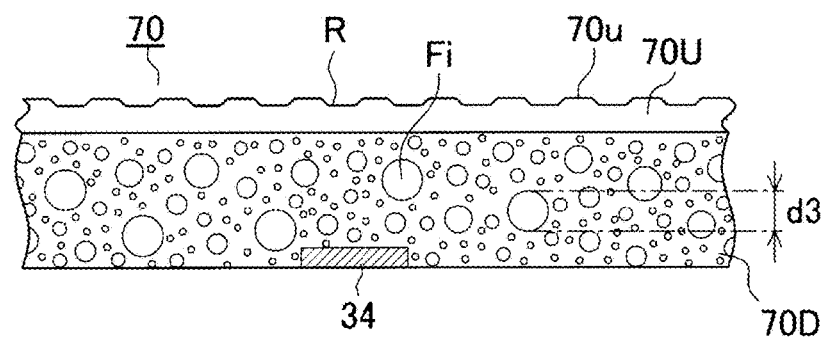
FIG. 3A to FIG. 3C show views of an enlarged solder-resist layer.
Figure 3B:
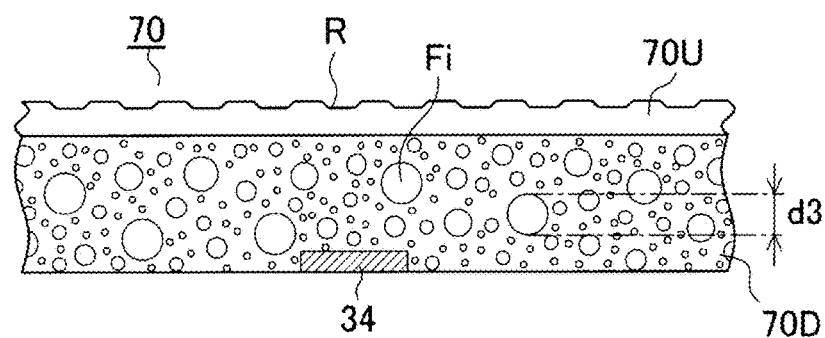
Figure 3C:
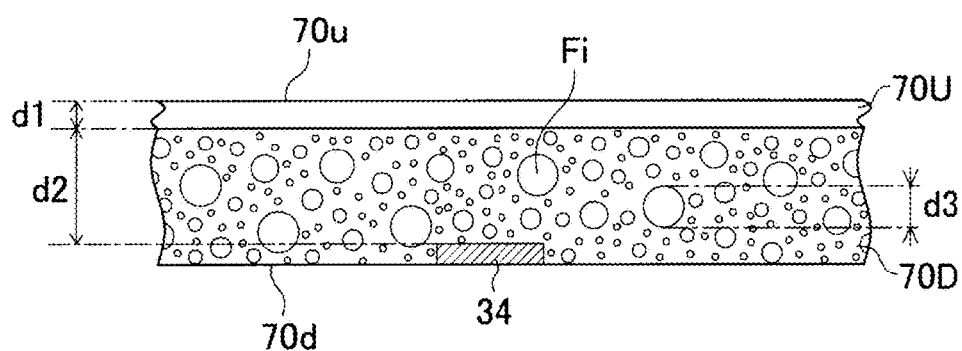

FIG. 3C is an enlarged view of solder-resist layer 70 of the first embodiment.

Lower layer (70D) contains an epoxy resin and inorganic particles (Fi) as main components. The amount of inorganic particles in lower layer (70D) is 40 wt. % to 70 wt. %, for example. Examples of inorganic particles are particles of silica, alumina, aluminum nitride and magnesium oxide. The size of inorganic particles is 0.05 µm to 5.0 µm, and average particle size (d4) is 0.5 µm, for example. The shape of inorganic particles (Fi) is preferred to be spherical. Maximum particle size (d3) of inorganic particles (Fi) is 5 µm.

Upper layer (70U) contains an epoxy resin as its main component.

The resin components of lower layer (70D) and upper layer (70U) may be the same as or different from each other, but the components are preferred to be the same.

Upper layer (70U) has thickness (d1) and lower layer (70D) has thickness (d2). Thickness (d2) is the distance between upper layer (70U) and conductive layer 34. Thickness (d1) is smaller than thickness (d2). The ratio of thickness (d1) to thickness (d2) (d1/d2) is set at 0.05 to 0.3. Thickness (d1) is preferred to be greater than average particle size (d4) of inorganic particles (Fi) in lower layer (70D). Moreover, thickness (d1) is preferred to be no greater than one half of maximum particle size (d3) of inorganic particles (Fi). By so setting, inorganic particles (Fi) are unlikely to be exposed on upper surface (70u) of solder-resist layer 70.

FIG. 3A shows a solder-resist layer as another example of the first embodiment.

As shown in FIG. 3A, upper surface (70u) of solder-resist layer 70 may also be set to have roughened surface (R). Irregularities are formed on upper surface (70u). Roughened surface (R) is formed almost entirely on upper surface (70u). The degree of roughened surface (R) is indicated as (Ra) (arithmetic mean roughness), for example. (Ra) is set at 0.1 µm to 0.3 µm, for example at 0.2 µm. When irregularities are formed on upper surface (70u), the surface area of upper surface (70u) of solder-resist layer 70 is enlarged, thereby increasing the contact area between solder-resist layer 70 and underfill 94. Accordingly, underfill 94 is unlikely to peel off solder-resist layer 70. The printed wiring board of the embodiment is structured to have upper layer (70U) that does not contain inorganic particles (Fi). Thus, even if irregularities are formed on upper surface (70u), inorganic particles (Fi) are unlikely to be exposed to the outside.

In the printed wiring board of the first embodiment, inorganic particles are unlikely to be exposed on upper surface (70u) of solder-resist layer 70. Underfill 94 does not make contact, or has significantly fewer contact portions, with inorganic particles (Fi) in solder-resist layer 70, thus achieving strong adhesiveness between solder-resist layer 70 and underfill 94. The reliability of applied example 100 is enhanced.

FIG. 1A to FIG. 1F show a method for manufacturing printed wiring board 10 and applied example 100.

As shown in FIG. 1A, solder resist (70α) according to the first embodiment is prepared. Solder resist (70α) is structured to have inorganic filler-containing uncured first layer (70Dα) to form lower layer (70D) and uncured second layer (70Uα) to form upper layer (70U). For the sake of manufacturing convenience, it is preferred to sandwich solder resist (70α) with two films (70A, 70B). In FIG. 1A, uncured first layer (70Dα) is formed on first film (70B), and uncured second layer (70Uα) is formed on uncured first layer (70Dα). Second film (protective film) (70A) is further formed on uncured second layer (70Uα). Second film (70A) has third surface (70A3) and fourth surface (70A4) opposite third surface (70A3), and third surface (70A3) is set to be in contact with uncured second layer (70Uα). Third surface (70A3) is flat in FIG. 1A.

As shown in FIG. 1B, printed wiring board 20 in an intermediate stage is prepared. Intermediate printed wiring board 20 is structured to have resin insulation layer 30 having first surface (F) and second surface (S) opposite first surface (F), and conductive layer 34 formed on the first surface of resin insulation layer 30. In FIG. 1B, resin insulation layer 30 is the outermost resin insulation layer, and conductive layer 34 is the outermost conductive layer.

First film (70B) is removed from solder resist (70α). Then, solder resist (70α) is laminated on first surface (F) and on conductive layer 34 of intermediate printed wiring board 20 shown in FIG. 1B (FIG. 1C). At that time, uncured first layer (70Dα) is set to face first surface (F). On intermediate printed wiring board 20, second film (70A) is also laminated along with solder resist (70α). Then, solder resist (70α) is exposed to light through second film (70A). Solder resist (70α), excluding portions of solder resist (70α) on pads (34P), is cured. Second film (70B) is removed. When developed, solder resist (70u) on pads (34P) is removed. Solder-resist layer 70 with openings 71 is formed on first surface (F) of resin insulation layer 30 (FIG. 1D). In FIG. 1D, solder-resist layer 70 is also formed on conductive layer 34. Printed wiring board 10 is completed.

Solder bumps 76 are formed on pads (34P) in openings 71. Printed wiring board 10 having solder bumps 76 is completed (FIG. 1E). Electronic component 90 is mounted on printed wiring board 10 through solder bumps 76. Underfill 94 is filled between solder-resist layer 70 and electronic component 90 (FIG. 1F). Underfill 94 is filled in the narrow gap between electronic component 90 and solder-resist layer 70. In the printed wiring board of the first embodiment, since no inorganic filler is exposed on upper surface (70u) of solder-resist layer 70, upper surface (70u) of solder-resist layer 70 is most likely to have a uniform surface condition. Accordingly, underfill 94 exhibits substantially uniform wettability to upper surface (70u) of solder-resist layer 70. It is easier to fill underfill 94 even in a small gap.

In the example shown in FIG. 1A to 1F, upper surface (70u) of solder-resist layer 70 is flat. Next, an example is shown how to roughen upper surface (70u).

Printed wiring board 10 shown in FIG. 1D is prepared as intermediate substrate 40. Then, upper surface (70u) of solder-resist layer 70 is roughened by a physical or chemical method. In examples of a physical method, $O_2$ plasma or blasting is used, where $O_2$ plasma or particles are irradiated on upper surface (70u) of solder-resist layer 70. In examples of a chemical method, chemical solutions are used. For example, upper surface (70u) is roughened by immersing intermediate substrate 40 of FIG. 1D in a permanganate solution. Printed wiring board 10 is completed, having solder-resist layer 70 shown in FIG. 3A. Upper surface (70u) of solder-resist layer 70 in FIG. 3A has roughened surface (R).

Figure 4A:
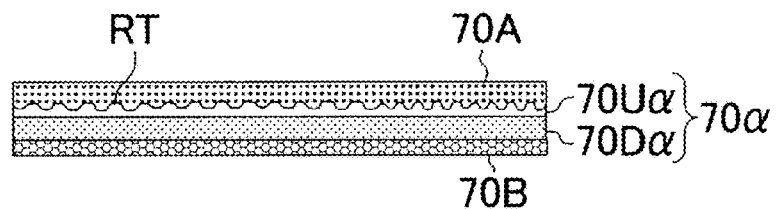
FIG. 4A to FIG. 4E show processes for manufacturing a solder resist according to another example of each embodiment.

Following is another example of preparing upper surface (70u) with roughened surface (R). In the other example, solder resist (70α) shown in FIG. 4A is prepared. Solder resist (70u) in FIG. 4A is different from solder resist (70α) in FIG. 1A. In solder resist (70α) in FIG. 4A, uncured second layer (70Uα) has roughened surface (RT) at the interface between uncured second layer (70Uα) and second film (70A). Except for roughened surface (RT), solder resist (70α) in FIG. 4A is the same as that in FIG. 1A. Using the same method as in FIG. 1C, solder resist (70α) in FIG. 4A is laminated on intermediate printed wiring board 20 shown in FIG. 1B. Openings 71 are formed in solder-resist layer 70 by the same method as in FIG. 1D. At that time, upper layer (70u) of solder-resist layer 70 has roughened surface (RT). Using solder resist (70α) prepared as in FIG. 4A simplifies the manufacturing method.

The following shows a method for forming roughened surface (RT) on uncured second layer (70Uα).

Figure 4B:
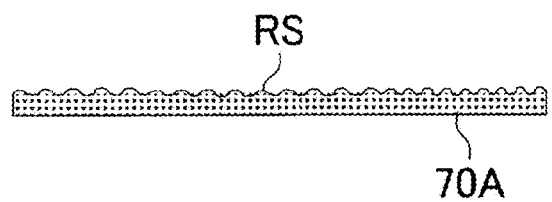
Figure 4C:
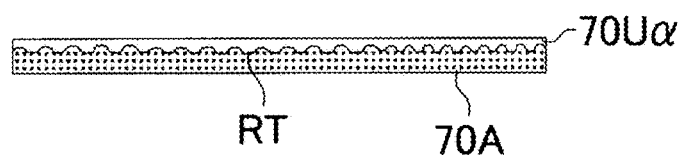

Second film (70A) having irregularities (RS) is prepared (FIG. 4B). Roughened surface (RT) is formed when uncured second layer (70Uα) is formed on irregularities (RS) of second film (70A). By a coating process, for example, second layer (70Uα) is formed on irregularities (RS) of second film (70A). Then, first layer (70Dα) and first film (70B) are consecutively formed on second layer (70Uα). Accordingly, solder resist (70α) shown in FIG. 4A is formed.

Another method for forming roughened surface (RT) is shown below.

First layer (70Dα) and second layer (70Uα) are consecutively formed on first film (70B). Then, when second layer (70Uα) is compressed on second film (70A) with irregularities (RS), roughened surface (RT) is prepared.

Roughened surface (RT) is formed to conform to irregularities (RS) of second film (70A). Irregularities (RS) of second film (70A) conform to the shape of roughened surface (RT).

Openings 71 are formed in solder-resist layer 70 by using a laser. A laser is irradiated at second film (70A). The laser penetrates through second film (70A) and solder-resist layer 70 and reaches pads (34P).

Second Embodiment

Figure 2A:
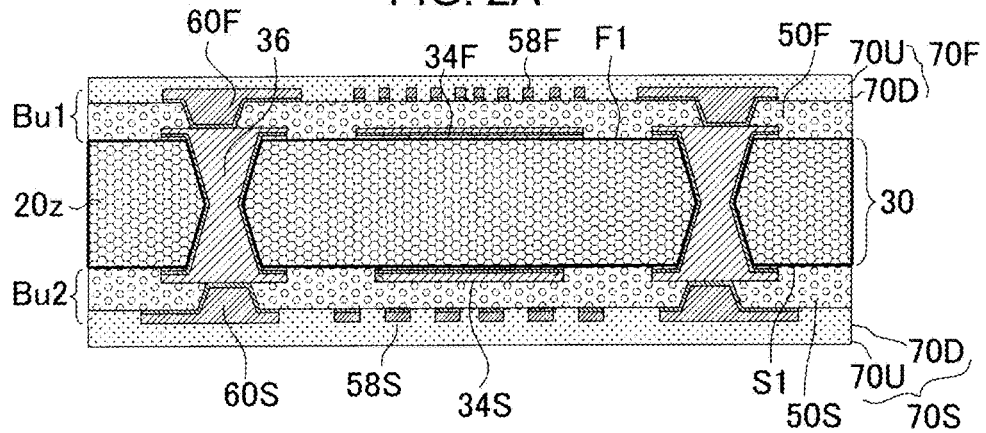
FIG. 2A to FIG. 2C show processes for manufacturing a printed wiring board according to a second embodiment.
Figure 2B:
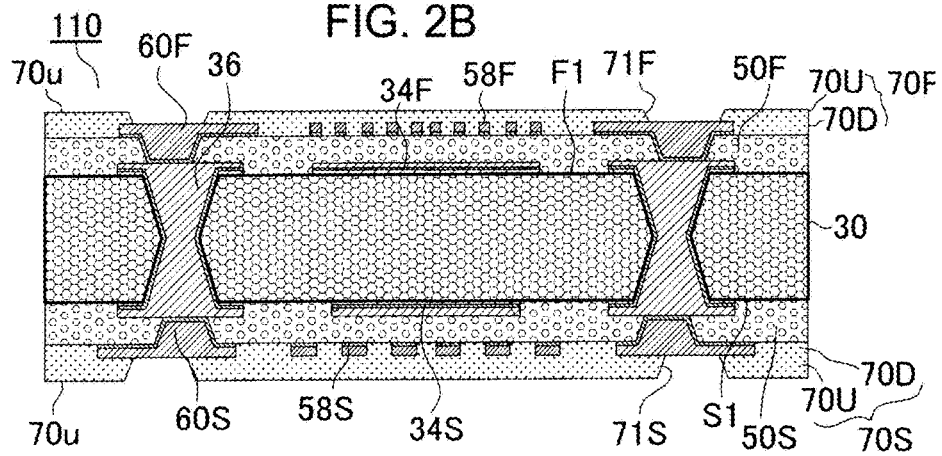

FIG. 2B shows printed wiring board 110 according to a second embodiment. Upper surfaces (70u) of solder-resist layers (70F, 70S) of printed wiring board 110 shown in FIG. 2B do not have roughened surface (RT).

Printed wiring board 110 of the second embodiment is structured to have core substrate 30 having top surface (F1) and bottom surface (S1) opposite top surface (F1), first buildup layer (Bu1) formed on top surface (F1) of core substrate 30, second buildup layer (Bu2) formed on bottom surface (S1) of core substrate 30, first solder-resist layer (70F) formed on first buildup layer (Bu1), and second solder-resist layer (70S) formed on second buildup layer (Bu2). First solder-resist layer (70F) is formed to be the same as solder-resist layer 70 of printed wiring board 10 in the first embodiment. Second solder-resist layer (70S) is formed to be the same as solder-resist layer 70 of printed wiring board 10 in the first embodiment.

Core substrate 30 is structured to have substrate (20z) having top surface (F1) and bottom surface (S1) opposite top surface (F1), first conductive layer (34F) formed on top surface (F1) of substrate (20z), second conductive layer (34S) formed on bottom surface (S1) of substrate (20z), and through-hole conductors 36 connecting first conductive layer (34F) and second conductive layer (34S).

First buildup layer (Bu1) is structured to have first resin insulation layer (50F) formed on top surface (F1) of core substrate 30, first outermost conductive layer (58F) on first resin insulation layer (34F), and first via conductors (60F) connecting first outermost conductive layer (58F) and first conductive layer (34F).

Second buildup layer (Bu2) is structured to have second resin insulation layer (50S) formed on bottom surface (S1) of core substrate 30, second outermost conductive layer (58S) on second resin insulation layer (50S), and second via conductors (60S) connecting second conductive layer (34S) and second outermost conductive layer (58S). Solder-resist layers (70F, 70S) used in the second embodiment are each the same as solder-resist layer 70 in the first embodiment. First and second solder-resist layers (70F, 70S) are each formed to have lower layer (70D) which contains inorganic particles and upper layer (70U) which does not contain inorganic particles. The upper surfaces of first and second solder-resist layers (70F, 70S) each may have roughened surface (R).

First solder-resist layer (70F) has openings (71F) to expose first outermost conductive layer (58F). Second solder-resist layer (70S) has openings (71S) to expose second outermost conductive layer (58S).

Figure 2C:
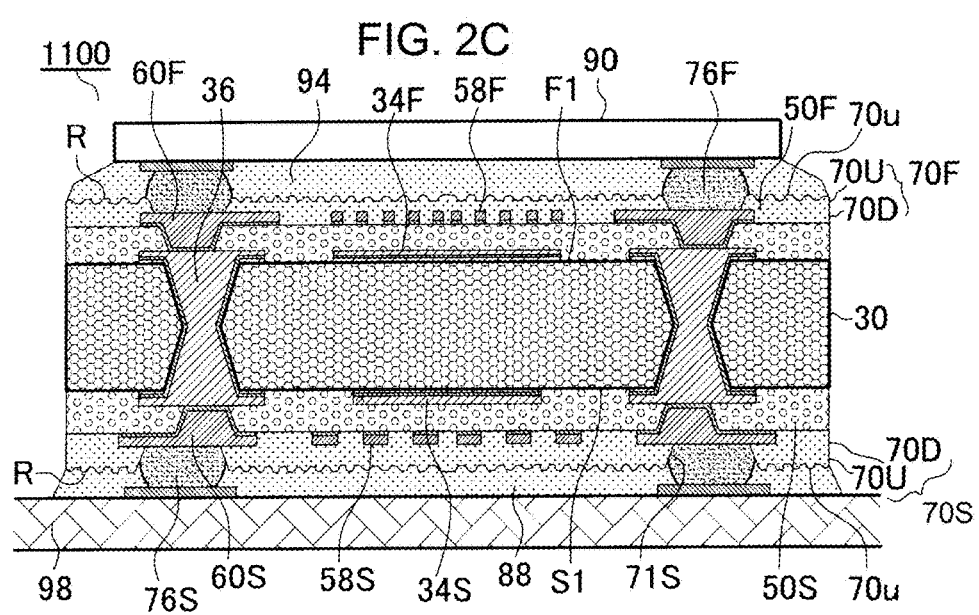

FIG. 2C shows applied example 1100 of printed wiring board 110 according to the second embodiment.

On printed wiring board 110 shown in FIG. 2C, each upper surface (70u) of solder-resist layers (70F, 70S) has roughened surface (R). Solder bumps (76F) are formed on first outermost conductive layer (58F) exposed in openings (71F). Electronic component 90 is mounted on printed wiring board 110 through solder bumps (76F). Solder bumps (76S) are formed on second outermost conductive layer (58S) exposed in openings (71S). Printed wiring board 110 is mounted on motherboard 98 through solder bumps (76S). Underfill 94 is filled between electronic component 90 and solder-resist layer (70F) of printed wiring board 110. Underfill 88 is filled between motherboard 98 and solder-resist layer (70S).

FIG. 3B shows an example of solder-resist layer 70 in each embodiment.

The following describes a method for manufacturing a printed wiring board containing the solder-resist layer shown in FIG. 3B.

A mixture of inorganic particles, a resin and a curing agent is prepared. The inorganic particles are silica particles, for example. Epoxy resin, for example, is used for the resin. The resin may also contain other polymer resins.

Figure 4D:
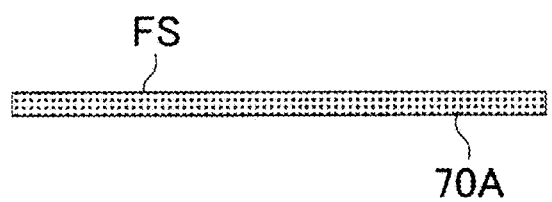

As shown in FIG. 4D, second film (70A) with flat surface (FS) is prepared.

Figure 4E:
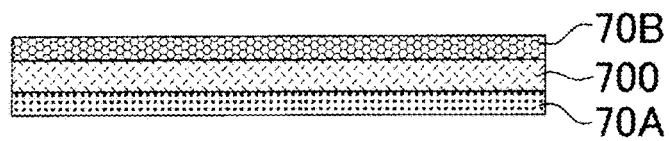

The mixture is coated on flat surface (FS) of second film (70A). Alternatively, as shown in FIG. 4B, second film (70A) having irregularities (RS) is prepared, and the mixture is coated on irregularities (RS) of second film (70A). Film 700 made of the mixture is formed on second film (70A) as shown in FIG. 4E. After the coating process, inorganic particles are observed to be dispersed substantially uniformly in film 700. Then, first film (70B) is further formed on film 700 made of the mixture (FIG. 4E). Film 700 made of the mixture is sandwiched by first film (70B) and second film (70A). Then, heat is applied on film 700 made of the mixture. The resin starts curing when heated. During that time, part of the uncured resin is separated and accumulates on a surface of the film made of the mixture, forming a layer of uncured resin having a predetermined thickness. Such a layer is referred to as a resin layer, for example. During the separation, inorganic particles are eliminated from the resin layer. The resin layer is formed directly on the second film (70A). Accordingly, between first film (70B) and second film (70A), a layer containing inorganic particles and a layer not containing inorganic particles are formed. The layer containing inorganic particles is referred to as lower layer (70D) and the layer not containing inorganic particles is referred to as upper layer (70U) (see FIG. 3B). Upper layer (70U) is formed on second film (70A), and lower layer (70D) is formed on first film (70B).

For example, the resin in the mixture on second film (70A) is made up of epoxy resins (A) and (B) and polymer resins (A) and (B). When heat is applied on the mixture, the curing rate of epoxy resin (A) and polymer resin (A) increases at certain temperature (TA). However, at temperature (TA), since epoxy resin (B) and polymer resin (B) do not start curing or have a slow curing rate, epoxy resin (B) and polymer resin (B) remain uncured at temperature (TA). During that time, epoxy resin (B) and polymer resin (B) accumulate on a surface layer of the mixture, thereby forming upper layer (70U) which does not contain inorganic particles. Simultaneously, curing progresses in epoxy resin (A) and polymer resin (A). When cured, inorganic particles are fixed in the resin made of epoxy resin (A) and polymer resin (A). When heat is further applied on the mixture, the temperature of the mixture reaches temperature (TB) (temperature TA<temperature TB), and curing progresses in epoxy resin (B) and polymer resin (B). Accordingly, solder resist (70α) is formed to have first layer (70Dα) and second layer (70Uα). Then, solder resist (70α) is laminated on the outermost resin insulation layer as shown in FIG. 1C, and solder-resist layer 70 is formed to have openings 71 made, for example, by a laser. Accordingly, printed wiring board 10 as shown in FIG. 1D is completed. After that, printed wiring board 10 is immersed in a permanganate solution. Among epoxy resin (B) and polymer resin (B) of upper layer (70U), polymer resin (B) is selectively dissolved in the permanganate solution. Roughened surface (R) is formed on upper surface (70u) of solder-resist layer 70. Solder-resist layer (70Gα) with roughened surface (R) is formed.

JPH05-7081A shows a solder-resist layer containing inorganic filler that is exposed on the surface of the solder-resist layer. As shown in JPH05-7081A, solder-resist layers may contain a component made of resin along with inorganic particles. When inorganic particles are exposed on the surface of a solder-resist layer, the solder-resist layer surface is thought to be made up of resin portions and inorganic portions. In such a formation, the surface condition of the solder-resist layer in the resin portions is thought to be different from that in the inorganic portions, making an uneven surface condition on the solder-resist layer. Such an uneven condition is thought to cause trouble.

A solder resist according to an embodiment of the present invention is structured to have a lower layer containing a first resin and one kind of particles belonging to a group of inorganic particles and an upper layer containing a second resin and formed on the lower layer. The upper layer does not contain any kind of particles belonging to a group of inorganic particles.

A printed wiring board according to an embodiment of the present invention is structured to have an outermost resin insulation layer, an outermost conductive layer formed on the outermost resin insulation layer, and a solder-resist layer formed on the outermost resin insulation layer and having openings to expose the outermost conductive layer. The solder-resist layer is structured to have a lower layer containing a first resin and one kind of particles belonging to a group of inorganic particles and an upper layer containing a second resin and formed on the lower layer; the upper layer does not contain any kind of particles belonging to a group of inorganic particles.

In an embodiment of the present invention, the solder resist has an upper layer that does not contain inorganic particles. Thus, there are no inorganic particles exposed thereon. In other words, virtually no exposure of inorganic particles occurs. Accordingly, using the solder resist of the embodiment, a solder-resist layer surface is formed with a resin. The upper surface of the solder-resist layer is made of a resin. The exposed surface of the solder-resist layer is formed with a resin. Therefore, the surface, upper surface or exposed surface of a solder-resist layer is likely to be made homogeneous.

Obviously, numerous modifications and variations of the present invention are possible in light of the above teachings. It is therefore to be understood that within the scope of the appended claims, the invention may be practiced otherwise than as specifically described herein.

The invention claimed is:

1. A solder resist, comprising:
   a lower layer comprising a first resin and a plurality of particles; and
   an upper layer comprising a second resin and formed on the lower layer such that the upper layer has an upper surface that is a roughened surface,
   wherein the first resin of the lower layer includes a first epoxy resin, the second resin of the upper layer includes a second epoxy resin, the plurality of particles is one kind selected from a group of inorganic particles, the upper layer is formed such that the upper layer does not contain any kind of particles belonging to the group of inorganic particles and has a thickness that is smaller than a thickness of the lower layer, and the first resin in the lower layer and the second resin in the upper layer are made such that the second resin has a curing temperature that is higher than a curing temperature of the first resin.

2. A solder resist according to claim 1, wherein the roughened surface of the upper layer has a roughness Ra in a range of 0.1 μm to 0.3 μm.

3. A solder resist according to claim 2, further comprising:
   a protective film formed on the upper surface of the upper layer such that the protective film has irregularities formed along the roughened surface of the upper layer.

4. A solder resist according to claim 2, wherein the first resin in the lower layer further includes a first polymer resin such that the first epoxy resin is a main component of the first resin, and the second resin in the upper layer further includes a second polymer resin such that the second epoxy resin is a main component of the second resin and that the second resin has the curing temperature that is higher than the curing temperature of the first resin.

5. A solder resist according to claim 1, wherein the upper layer has a thickness that is greater than an average particle size of the particles in the lower layer.

6. A solder resist according to claim 5, wherein the roughened surface of the upper layer has a roughness Ra in a range of 0.1 μm to 0.3 μm.

7. A solder resist according to claim 6, wherein the plurality of particles has a particle size in a range of 0.05 μm to 5.0 μm, and the upper layer is formed such that a ratio of the thickness of the upper layer to the thickness of the lower layer is in a range of 0.05 to 0.3.

8. A solder resist according to claim 1, wherein the first resin in the lower layer further includes a first polymer resin such that the first epoxy resin is a main component of the first resin, and the second resin in the upper layer further includes a second polymer resin such that the second epoxy resin is a main component of the second resin and that the second resin has the curing temperature that is higher than the curing temperature of the first resin.

9. A solder resist according to claim 1, wherein the group of inorganic particles comprises silica particles, alumina particles, aluminum nitride particles, and magnesium oxide particles.

10. A solder resist according to claim 1, wherein the plurality of particles has a particle size in a range of 0.05 μm to 5.0 μm.

11. A printed wiring board, comprising:
an outermost resin insulation layer;
an outermost conductive layer formed on the outermost resin insulation layer; and
a solder-resist layer formed on the outermost resin insulation layer and having a plurality of opening portions formed such that the opening portions are exposed portions of the outermost conductive layer,
wherein the solder-resist layer comprises a lower layer comprising a first resin and a plurality of particles, and an upper layer comprising a second resin and formed on the lower layer such that the upper layer has an upper surface that is a roughened surface, the first resin of the lower layer includes a first epoxy resin, the second resin of the upper layer includes a second epoxy resin, the plurality of particles is one kind selected from a group of inorganic particles, the upper layer is formed such that the upper layer does not contain any kind of particles belonging to the group of inorganic particles and has a thickness that is smaller than a thickness of the lower layer, and the solder-resist layer is made such that the second resin in the upper layer has a curing temperature that is higher than a curing temperature of the first resin in the lower layer.

12. A printed wiring board according to claim 11, wherein the roughened surface of the upper layer in the solder-resist layer has a roughness Ra in a range of 0.1 μm to 0.3 μm.

13. A printed wiring board according to claim 12, wherein the solder-resist layer comprises a protective film formed on the upper surface of the upper layer such that the protective film has irregularities formed along the roughened surface of the upper layer.

14. A printed wiring board according to claim 12, wherein the solder-resist layer is formed such that the first resin in the lower layer further includes a first polymer resin, that the first epoxy resin is a main component of the first resin, that the second resin in the upper layer further includes a second polymer resin, that the second epoxy resin is a main component of the second resin, and that the second resin has the curing temperature that is higher than the curing temperature of the first resin.

15. A printed wiring board according to claim 11, wherein the upper layer of the solder-resist layer has a thickness that is greater than an average particle size of the particles in the lower layer.

16. A printed wiring board according to claim 15, wherein the roughened surface of the upper layer in the solder-resist layer has a roughness Ra in a range of 0.1 μm to 0.3 μm.

17. A printed wiring board according to claim 16, wherein the plurality of particles has a particle size in a range of 0.05 μm to 5.0 μm, and the upper layer is formed such that the upper layer does not contain any kind of particles belonging to the group of inorganic particles and has the thickness that is no greater than one half of a maximum particle size of the inorganic particles.

18. A printed wiring board according to claim 11, wherein the solder-resist layer is formed such that the first resin in the lower layer further includes a first polymer resin, that the first epoxy resin is a main component of the first resin, that the second resin in the upper layer further includes a second polymer resin, that the second epoxy resin is a main component of the second resin, and that the second resin has the curing temperature that is higher than the curing temperature of the first resin.

19. A printed wiring board according to claim 11, wherein the solder-resist layer is formed such that the group of inorganic particles comprises silica particles, alumina particles, aluminum nitride particles, and magnesium oxide particles.

20. A printed wiring board according to claim 11, wherein the solder-resist layer is formed such that the plurality of particles has a particle size in a range of 0.05 μm to 5.0 μm.

* * * * *